United States Patent
Chang et al.

(10) Patent No.: US 8,203,879 B2
(45) Date of Patent: Jun. 19, 2012

(54) NON-VOLATILE MEMORY AND OPERATION METHOD THEREOF

(75) Inventors: Yao-Wen Chang, Hsinchu (TW); Tao-Cheng Lu, Hsinchu (TW)

(73) Assignee: MACRONIX International Co., Ltd., Hsinchu (TW)

( * ) Notice: Subject to any disclaimer, the term of this patent is extended or adjusted under 35 U.S.C. 154(b) by 176 days.

(21) Appl. No.: 12/834,233

(22) Filed: Jul. 12, 2010

(65) Prior Publication Data
US 2012/0008388 A1   Jan. 12, 2012

(51) Int. Cl.
*G11C 11/34* (2006.01)

(52) U.S. Cl. ......... 365/185.03; 365/185.18; 365/185.22; 365/185.24

(58) Field of Classification Search ............. 365/185.03, 365/185.18, 185.22, 185.24
See application file for complete search history.

(56) References Cited

U.S. PATENT DOCUMENTS

| | | | | |
|---|---|---|---|---|
| 7,535,766 B2 * | 5/2009 | Ito | .......................... | 365/185.22 |
| 7,633,797 B2 * | 12/2009 | Chen et al. | ............... | 365/185.03 |
| 7,684,250 B2 * | 3/2010 | Chae | .......................... | 365/185.22 |
| 7,692,970 B2 * | 4/2010 | Park et al. | ................ | 365/185.22 |
| 2007/0121386 A1 | 5/2007 | Ho et al. | | |
| 2007/0159880 A1 | 7/2007 | Eitan | | |
| 2007/0297227 A1 | 12/2007 | Wu | | |

* cited by examiner

Primary Examiner — Son Dinh
(74) Attorney, Agent, or Firm — J.C. Patents

(57) ABSTRACT

An operation method of a non-volatile memory suitable for a multi-level cell having a first storage position and a second storage position is provided. The operation method includes: setting a main voltage distribution group and a plurality of secondary voltage distribution groups, wherein each of the main voltage distribution group and the secondary voltage distribution groups includes N threshold-voltage distribution curves, and N is an integer greater than 2; selecting a first operation level and a second operation level according to a programming command; programming the first storage position according to the threshold-voltage distribution curve corresponding to the first operation level in the main voltage distribution group; selecting one of the secondary voltage distribution groups according to the first operation level and programming the second storage position according to the threshold-voltage distribution curve corresponding to the second operation level in the selected secondary voltage distribution group.

14 Claims, 7 Drawing Sheets

NON-VOLATILE MEMORY AND OPERATION METHOD THEREOF

BACKGROUND OF THE INVENTION

1. Field of Invention

The present invention relates to a non-volatile memory and an operation method thereof More particularly, the present invention relates to a non-volatile memory having a multi-level cell that includes multiple storage positions and an operation method thereof.

2. Description of Related Art

A charge trapping memory (NBit) is a nitride structure memory using silicon nitride as a charge trapping layer instead of using a polysilicon floating gate, in which a single NBit memory cell may have two separate charge bits according to a localized charge trapping technique, so as to form a so-called 2 bits/cell storage scheme. Further, by respectively programming the two bits of the NBit memory cell to a plurality of levels, the NBit memory cell may also serve as a multi-level cell (MLC).

During the operation of an NBit memory cell, the two bits in a same memory cell influence each other leading to an erroneous reading. Alternatively speaking, if one side of the NBit memory cell is stored with a bit and the other side of the NBit memory cell is read, a current of an originally high current part can be decreased, which leads to a so-called second-bit effect. Namely, when a read operation is performed to the NBit memory cell, the originally existed bit can influence the memory cell to increase a read threshold voltage (Vt). In this case, the read error problem is likely to occur.

FIG. 1 is a diagram illustrating a threshold voltage distribution of a conventional nitride structure MLC. As shown in FIG. 1, curves 110-140 are threshold-voltage distribution curves when a state of the memory cell is respectively level 1 to level 4. If a first storage position of the NBit memory cell is maintained at level 1, a second storage position of the NBit memory cell is programmed to level 2, and the threshold voltage distribution curve of the first storage position maintained at level 1 is shifted due to the second-bit effect, and the degree of shifting is shown by curve 150. Similarly, curves 160 and 170 respectively represent the degree of shifting of the threshold voltage distribution curve of the first storage position maintained at level 1 that is generated due to the second-bit effect when the second storage position of the NBit memory cell is respectively programmed to level 3 and level 4.

As shown in FIG. 1, the higher level the second storage position is programmed to, the more severe the second-bit effect is. For example, when the second storage position is programmed to level 4, the threshold voltage shift curve 170 of the first storage position generated due to the second-bit effect partially overlaps with the threshold voltage distribution curve 120. If the NBit memory cell is read now, the level 1 first storage position can be misjudged to be level 2, the device reliability is decreased. Moreover, the second-bit effect further reduces a read sense margin of the memory and a threshold-voltage window for operating the right and left bits, so that operation of the MLC becomes more difficult.

SUMMARY OF THE INVENTION

An embodiment of this invention provides an operation method of a nonvolatile memory for increasing the reliability of the memory.

An embodiment of this invention provides a nonvolatile memory in which the problems of erroneous reading of the memory due to the second bit effect may be obviated.

An embodiment of this invention provides an operation method of a nonvolatile memory, wherein the method is applicable to a multi-level cell having a first storage position and a second storage position, and the operating method of the non-volatile memory includes at least the following process steps. A main voltage distribution group and a plurality of secondary voltage distribution groups are set for defining N levels, wherein each of the main voltage distribution group and the plurality of secondary voltage distribution groups includes N threshold voltage distribution curves, corresponding to the N levels, wherein N is an integer greater than 2. Further, a first operation level and a second operation level are selected from these levels according to a programming command. A first storage position is programmed to a first operation level according to the threshold voltage distribution curve, corresponding to the first operation level, in the main voltage distribution group. Moreover, one of the secondary voltage distribution groups is selected according to the first operation level, and the second storage position is programmed to the second operation level according to the threshold voltage distribution curve, corresponding to the second operation level, in the selected secondary voltage distribution group.

According to an exemplary embodiment of the invention, the above setting of these secondary voltage distribution groups includes at least the following steps. N reference curves are set, wherein the distance between the first reference curve and the second reference curve is obtained based on the sum of a shift amount and a sense window, the distance between two adjacent reference curves among the second reference curve to the N reference curve is the sense window. The second to the N reference curves are concurrently moved in a predetermined direction toward the first reference curve to reduce the distance between the first reference curve and the second reference curve. Further, the threshold voltage distribution curves in the first secondary voltage distribution group are set according to these reference curves after the distance is reduced. Then, the threshold voltage distribution curves in the second secondary voltage distribution group are set according to these reference curves. Additionally, the second to the N reference curves are moved concurrently along a direction opposite to the predetermined direction to increase the distance between the first and the second reference curves and to set the threshold voltage distribution curves in the third secondary voltage distribution group according the N reference curves after the distance is increased.

According to an exemplary embodiment, the above selection of one secondary voltage distribution group from the plurality of secondary voltage distribution groups according to the first operation level includes at least the following steps. When the first operation level is a first level among the N levels, a first secondary voltage distribution group is selected from these secondary voltage distribution groups. When the first operation level is one of a second level through an N–1$^{th}$ level among the N levels, the second secondary voltage distribution group is selected from these secondary voltage distribution groups. Further, when the first operation level is an N$^{th}$ level among the N levels, the third secondary voltage distribution group is selected from these secondary voltage distribution groups.

According to an exemplary embodiment of the invention, the operation method of the above non-volatile memory further includes reading the first storage position according to the main voltage distribution group, and selecting one of these secondary voltage distribution groups as a special voltage distribution group according to the read result of the first storage position and reading the second storage position according to the special voltage distribution group.

Embodiments of this invention provide a non-volatile memory that includes a source region, a drain region, a charge storage structure, a gate and a logic circuit. The source region and the drain region are configured in a substrate. The charge storage structure is configured on the substrate between the source region and the drain region, wherein the charge storage structure includes a first storage position and a second storage position. The gate structure is disposed on the charge storage structure. The logic circuit is used to set a main voltage distribution group and a plurality of secondary voltage distribution groups, wherein each of the main voltage distribution group and these secondary voltage distribution groups includes N threshold voltage distribution curves, wherein each of the main voltage distribution group and these secondary voltage distribution groups corresponds to N levels, wherein N is an integer greater than 2.

Moreover, the logic circuit selects a first operation level and a second operation level from the N levels according to a programming command. Further, the logic circuit programs the first storage position to the first operation level according to the threshold voltage distribution curve, corresponding to the first operation level, in the main voltage distribution group. Additionally, the logic circuit selects one of the secondary voltage distribution groups according to the first operation level and programs the second storage position to the second operation level according to the threshold voltage distribution curve, corresponding to the second operation level, in the selected secondary voltage distribution group.

According to the exemplary embodiment of the invention discussed above, a main voltage distribution group and a plurality of secondary voltage distribution groups are preset, and the programming and the reading of the first storage position and the second storage position are executed according to the main voltage distribution group and different secondary voltage distribution groups. Moreover, the secondary voltage distribution group corresponding to the second storage position is selected according to the level of the first storage position. Hence, by replacing the secondary voltage distribution group, the problems of not being able to identify level 1 and level 2 due to the second bit effect could be avoided, and the reliability of the device is thereby increased.

It is to be understood that both the foregoing general description and the following detailed description are exemplary, and are not intended to limit the scope of the invention.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE PREFERRED EMBODIMENTS

Figure 1:
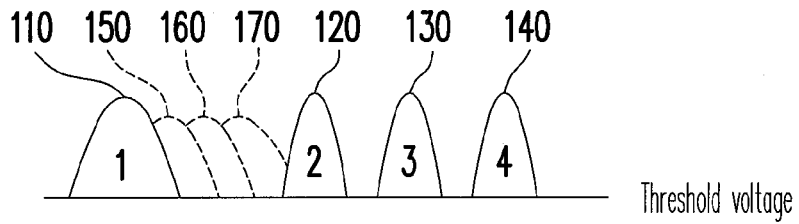
FIG. 1 is a diagram illustrating a threshold voltage distribution of a conventional nitride structure MLC.
Figure 2:
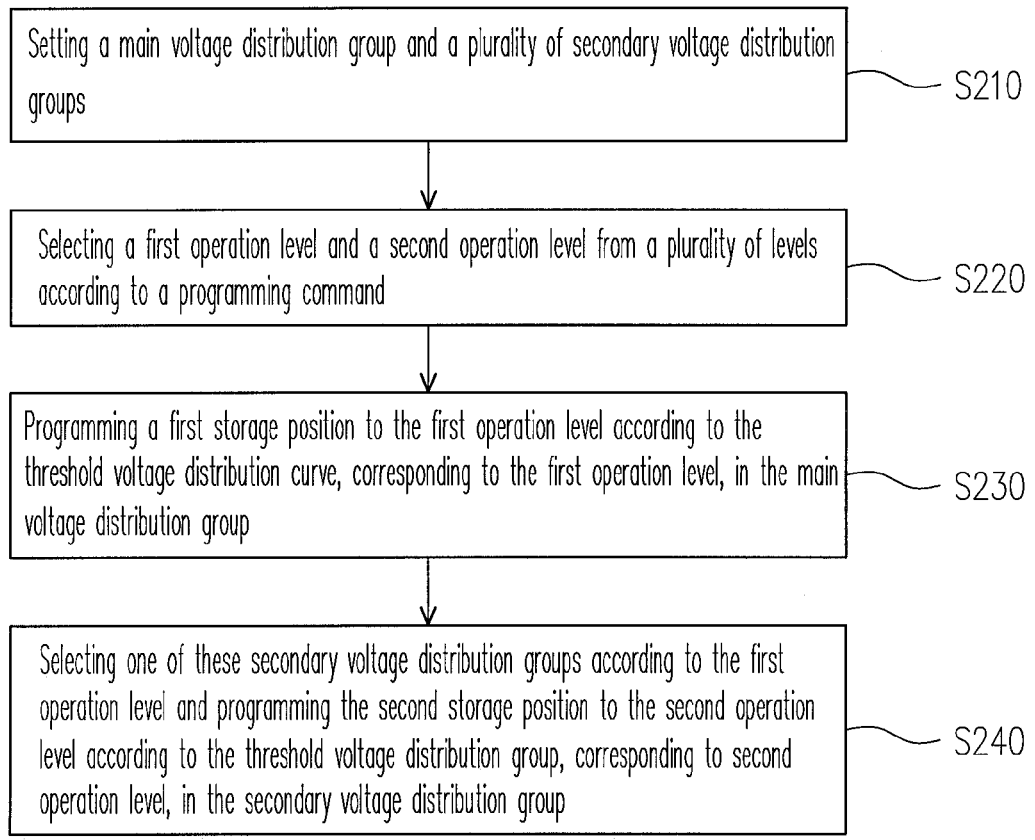
FIG. 2 is a flow chart of steps in exemplary processes that may be used in the programming method of a non-volatile memory according to an exemplary embodiment of the invention.
Figure 3A:
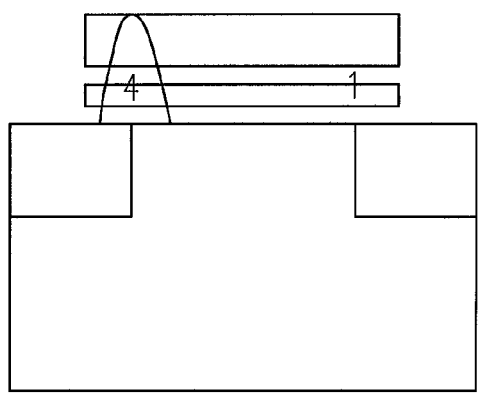
FIG. 3A to 3C are schematic diagrams of representations of an MLC according to an embodiment of the present invention.
Figure 3B:
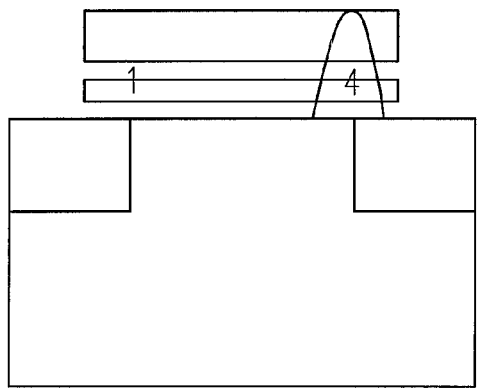
Figure 3C:
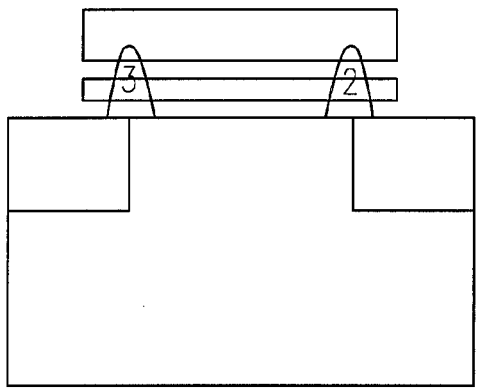

FIG. 2 is a flow chart of steps in exemplary processes that may be used in the programming method of a non-volatile memory according to an exemplary embodiment of the invention. The programming method of an exemplary embodiment is applicable to a multi-level cell (MLC) having a first storage position and a second storage position. Further, FIGS. 3A to 3C are diagrams of representations of an MLC according to an embodiment of the present invention. The MLC includes a source region, a drain region, a charge storage structure and a gate. The source region and the drain region are disposed in the substrate. The charge storage structure is disposed on the substrate between the source region and the drain region, and the charge storage structure includes a first storage position and a second storage position. The gate is disposed on the charge storage structure.

In the following exemplary embodiment, the MLC is assumed to have 4 levels (N=4), so the states of the MLC include a $1^{st}$ to a $4^{th}$ ascending levels 1-4. Further in the following exemplary embodiment, "xy" represents the levels of the first storage position and the second storage position. For example, as shown in FIG. 3A, in the state "14", "1" represents the level of the first storage position and "4" represents the level of the second storage position. As shown in FIG. 3B, in the state "41", "4" represents the level of the first storage position, and "1" represents the level of the second storage position. As shown in FIG. 3C, in the state "23", "2" represents the level of the first storage position, while "3" represents the level of the second storage position.

Still referring to FIG. 2, in order to define the level of the storage positions, in step S210, a main voltage distribution group and a plurality of secondary voltage distribution groups are set, wherein each of the main voltage distribution group and the plurality of secondary voltage distribution groups respectively includes N threshold voltage distribution curves, wherein N is an integer greater than 2. Moreover, the N threshold voltage distribution curves correspond to N levels. Accordingly, the main voltage distribution group and the plurality of secondary voltage distribution groups are set for defining N levels.

Figure 4:
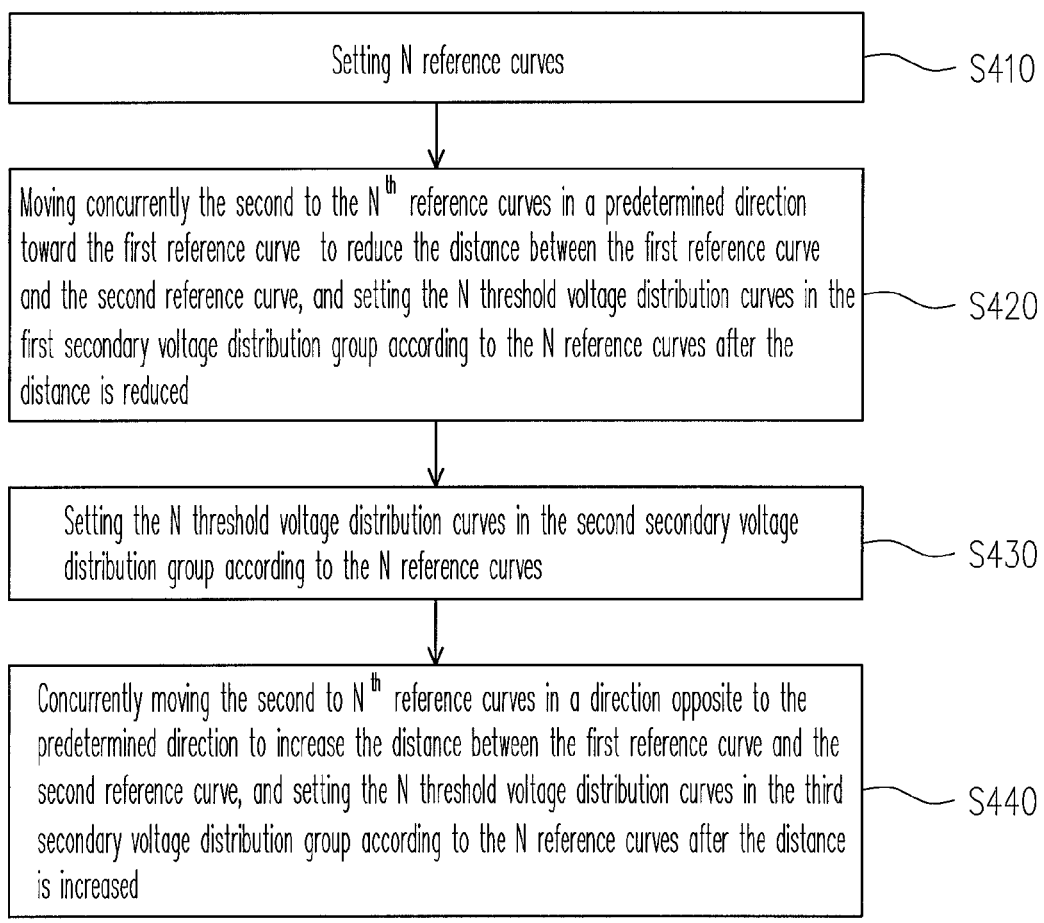
FIG. 4 is a flow chart of steps that may be used in an exemplary method of setting a plurality of secondary voltage distribution groups according to an exemplary embodiment of the invention.
Figure 5:
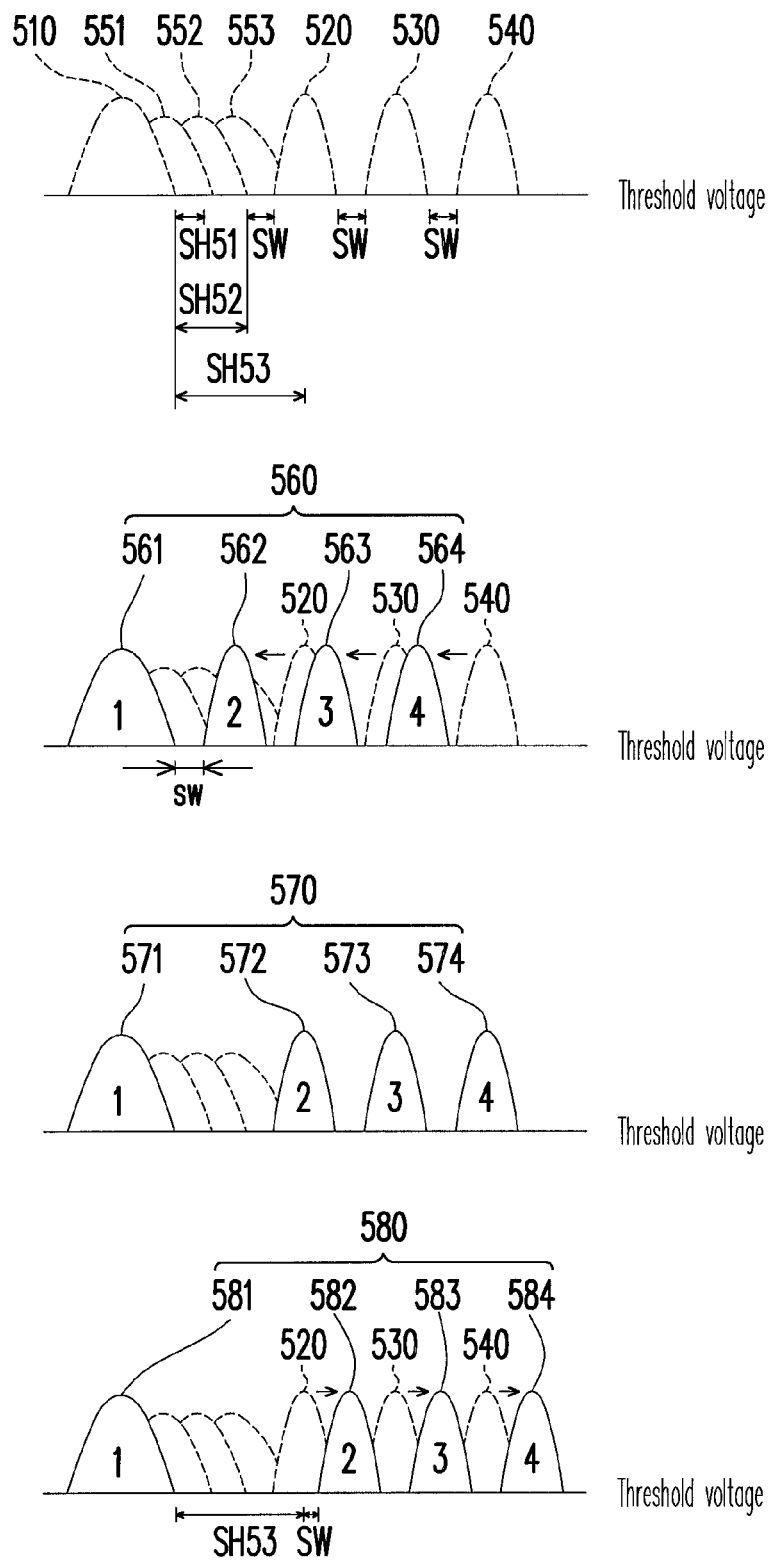
FIG. 5 is a threshold voltage distribution diagram of the reference curve and the secondary voltage distribution groups.

An example is illustrated in FIG. 4, wherein FIG. 4 is a flow chart of steps that may be used in an exemplary method of setting a plurality of secondary voltage distribution groups according to an exemplary embodiment of the invention. In the process of setting the plurality of secondary voltage distribution groups, N reference curves are firstly set in step S410. For example, FIG. 5 is a threshold voltage distribution diagram of the reference curves and the secondary voltage distribution groups. As shown in FIG. 5, the multi-level memory has 4 levels (N=4); hence, in step S410, four reference curves 510 to 540 are set. Moreover, considering the second bit effect, the shifting of the reference curve 510 due to the formation of the reference curves 520 to 540 are respectively represented by threshold voltage shift curves 551 to 553, and the shift amounts are respectively depicted by reference numbers SH51 to SH53. The distance between the first reference curve 510 and the second reference curve 520 is the sum of the shift amount SH52 and a sense window SW. In other words, the reference curves 510 to 540 are set without the consideration of the shift amount SH53 of the reference curve 510 formed due to the reference curve 540.

After setting the reference curves 510 to 540, in step S420, the second to the $N^{th}$ reference curves are moved concurrently in a predetermined direction toward the first reference curve 510 to reduce the distance between the first reference curve and the second reference curve. For example, as shown in FIG. 5, the second reference curve to the fourth reference curve 520 to 540 are concurrently moved in a direction toward the first reference curve 510 to reduce the distance to a sense window SW between the first reference curve 510 and the second reference curve 520, and the second to the fourth reference curves 520 to 540 maintain a distance of the sensing window SW among one and other. Accordingly, by referring to the reference curves 510 to 540 after the distance is reduced, a first, secondary voltage distribution group 560 is defined. The threshold voltage distribution curves in the first, secondary voltage distribution group 560 are depicted by reference numbers 561 to 564, wherein the threshold voltage distribution curves 561 to 564 respectively correspond to levels 1 to 4.

Moreover, as shown in step S430, the threshold voltage distribution curves in the second, secondary voltage distribution group are set according to these reference curves. For example, as shown in FIG. 5, the threshold voltage distribution curves in the second, secondary voltage distribution group 570 are set by referring to the reference curves 510 to 540. Further, as shown in step S440, the second to the $N^{th}$ reference curves are concurrently moved in a direction opposite to the predetermined direction to increase the distance between the first reference curve and the second reference curve, and the threshold voltage distribution curves in the third, secondary voltage distribution group are set according to these reference curves subsequent to the distance is increased.

Referring to FIG. 5, the second to the fourth reference curves 520 to 540 move concurrently in a direction away from the first reference curve 510 to increase the distance between the reference curve 510 and the reference curve 520, and the second reference curve to the fourth reference curves 520-540 maintain a distance of a sensing window SW among one and other. The distance between the first reference curve 510 and the second reference curve 520 is the sum of the shift amount SH53 and the sense window SW. Accordingly, a third, secondary voltage distribution group 580 is defined according to the reference curves 510 to 540 subsequent to the distance is increased. Further, the threshold voltage distribution curves in the third, secondary voltage distribution group 580 are depicted by the reference numbers 581 to 584, and the threshold voltage distribution curves respectively correspond to levels 1 to 4.

In other words, through the setting in step S410, the secondary voltage distribution groups 560 to 580 are obtained. Moreover, the main voltage distribution group may set according to the reference curves 510 to 540. It should be understood that the present invention is not limited as such, wherein the settings of the main voltage distribution group and the secondary voltage distribution group may be referred to different reference curves. Accordingly, the level of the first storage position may be set and determined according to the main voltage distribution group, while the level of the second storage position may be set and determined according to the secondary voltage distribution group, wherein the setting and the determination of the second storage position are related to the level of the first storage position.

Figure 6:
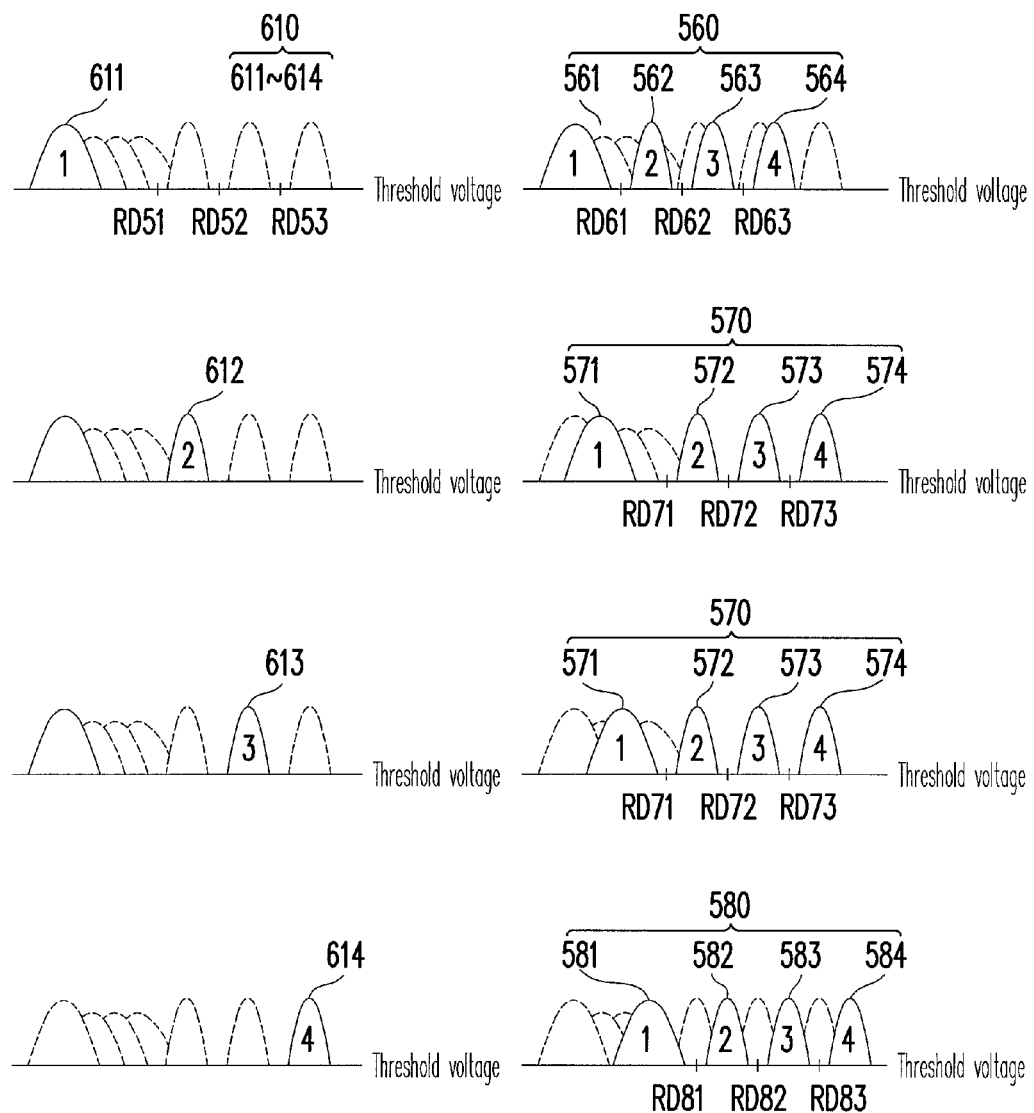
FIG. 6 is a schematic diagram showing the corresponding relationship of the threshold voltage distribution curves on the setting and the determination of the first storage position and the second storage position.

For the purpose of facilitating explanation, FIG. 6 is provided, wherein FIG. 6 is a schematic diagram showing the corresponding relationship of the threshold voltage distribution curves on the setting and the determination of the first storage position and the second storage position. As shown by the curves on the left in FIG. 6, the main voltage distribution group 610 is set by directly referring to the reference curves 510 to 540. The threshold voltage distribution curves in the main voltage distribution group are as shown by the reference number 611 to 614, and the threshold voltage distribution curves 611 to 614 respectively correspond to levels 1 to 4.

Correspondingly, as shown by the curves on the right in FIG. 6, the above plurality of secondary voltage distribution groups includes the secondary voltage distribution groups 560 to 580, and the secondary voltage distribution group 560 corresponds to the threshold voltage distribution curve 611, used in setting level 1, in the first voltage distribution curves, the secondary voltage distribution group 570 corresponds to the threshold voltage distribution curves 612 and 613, used in setting level 2 and level 3, in the main voltage distribution group 610, and the secondary voltage distribution group 580 corresponds to the threshold voltage distribution curve 614, used in setting level 4, in the main voltage distribution group 610. Moreover, under the influence of the second bit effect, comparing to FIG. 5 the positions of the threshold voltage distribution curves 571 and 581 in FIG. 6, corresponding to level 1, already shift to the right.

During an actual operation, as shown in FIG. 2, through step S220, a first operation level and a second operation level are selected from a plurality of levels according to a programming command. For example, in this exemplary embodiment, the multi-level memory cell has 4 levels, the states of the first storage position and the second storage position may be, for example, "11", "12", "13", "14", "21", "22", "23", "24", "31", "32", "33", "34", "41", "42", "43", "44".

Further, as shown in step S230, during the programming of the first storage position, the first storage position is programmed to the first operation position according to the threshold voltage distribution curve, corresponding to the first operating position, in the main voltage distribution group. For example, as shown in FIG. 6, if the first operating position is set as level 1, the threshold voltage distribution curve 611 in the main voltage distribution group 610 is used to program the first storage position. Moreover, if the first operating position is set as level 2, the first storage position is programmed according to the threshold voltage distribution curve 612 in the main voltage distribution group 610. The programming of the first storage position to level 3 and level 4 is accomplished according to the above method.

As shown in step S240, during the programming of the second storage position, one of the secondary voltage distribution groups is selected according to the first operating position. Further referring to the threshold voltage distribution curve, corresponding to the second operation level, in the selected secondary voltage distribution group, the second storage position is programmed to the second operating level. For example, as shown in FIG. 6, if the state of the first storage position and the second storage position is preset as "12", in which the first operation level and the second operation level are respectively set as level 1 and level 2, the second storage position is programmed according to the threshold voltage distribution curve 562 in the secondary voltage distribution group 560.

Additionally, if the preset states of the first storage position and the second storage position are "22", in which the first operation level and the second operation level are respectively set as level 2 and level 2, the secondary voltage distribution group 570 is selected according to the first operation level (level 2), and the second storage position is programmed by referring to the threshold voltage distribution curve 572 in the secondary voltage distribution group 570. Further, if the preset states of the first storage position and the second storage position are "42", which is the first operation level and the second operation level are respectively set as level 4 and level 2, the secondary voltage distribution group 580 is selected according to the first operation level (level 4), and the second storage position is programmed according to the threshold voltage distribution curve 582 in the secondary voltage distribution group 580.

Alternatively speaking, the detailed process flow in selecting one from these secondary voltage distribution groups according to the first operation level in accordance to exemplary embodiment of the invention includes: when the first operation level is the first level, a first, secondary voltage distribution group is selected from these secondary voltage distribution groups; when the first operation level is one of the second to the $(N-1)^{th}$ level, a second, secondary voltage distribution group is selected from these secondary voltage distribution groups; and when the first operation level is the $N^{th}$ level, a third, secondary voltage distribution group is selected from these secondary voltage distribution groups. It is worthy to note that, although the embodiment is exemplified by corresponding three secondary voltage distribution groups to 4 levels in the main voltage distribution group, the invention is not limited as such. One skilled in art should appreciate that 4 secondary voltage distribution groups may to correspond with the 4 levels in the main voltage distribution group.

Accordingly, when the first storage position is programmed to a lower level, the secondary voltage distribution group 560, subsequent to the distance reduction, is used to program the second storage position. When the first storage position is level 1, the threshold voltage distribution curves 564, used for setting the second storage position to level 4, shift to the left. Hence, the level of the first storage position is apparently lowered due to the influence of the second bit effect, and the problems of erroneous judgment on level 1 and level 2 of the first storage position are obviated. Correspondingly, when the first storage position is programmed to a higher level, the secondary voltage distribution group 580, subsequent to the increase of the distance, is used to program the second storage position. Therefore, when the first storage position is level 4, the threshold voltage distribution curves 582, used for setting the second storage position to level 2, shift to the right. Hence, the influence, created by the second bit effect, on the level of the second storage position can be obviated. It is worthy to note that, the threshold voltage distribution curves 580 is used to define the second storage position only when the first storage position is level 4. Accordingly, the worse second bit effect does not deteriorate the judgment of the first storage position because the first storage position is level 4. In other words, additional affect on the level of the first storage position by the second bit effect is prevented.

Figure 7:
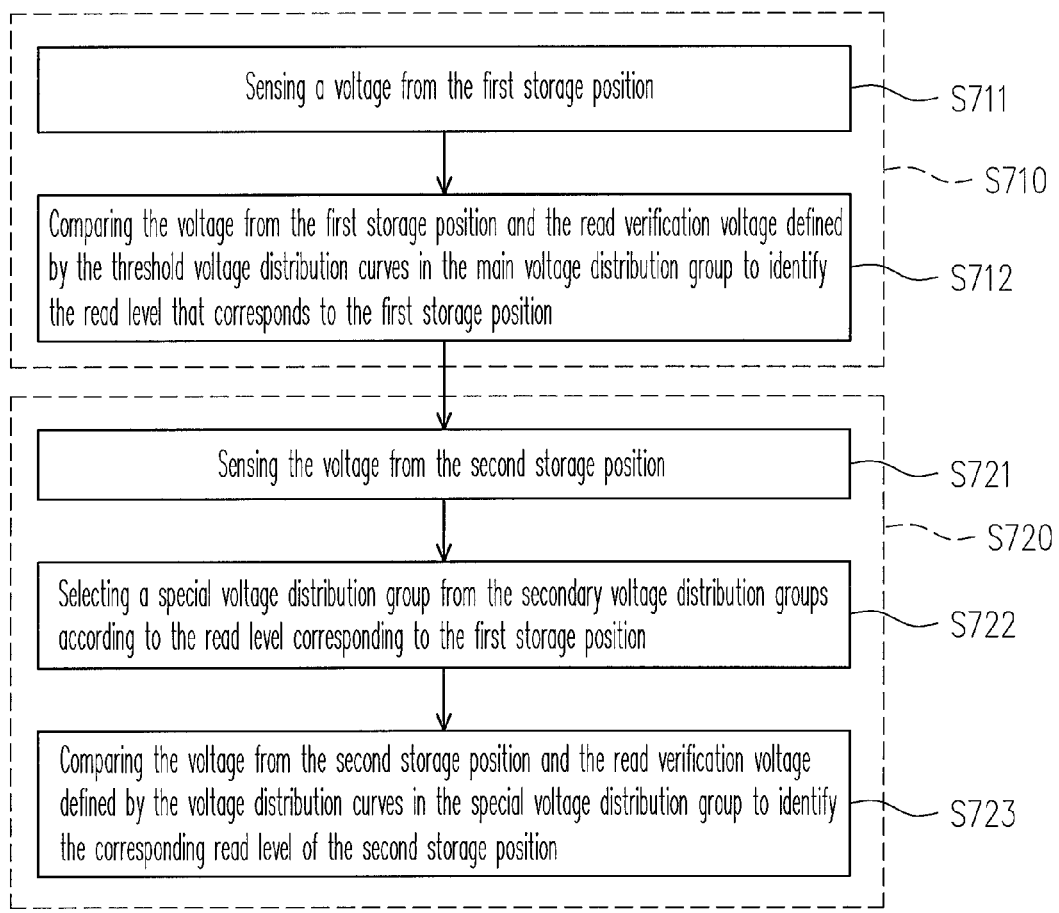
FIG. 7 is a flow chart of steps in exemplary processes that may be used in the reading method of a non-volatile memory according to an exemplary embodiment of the invention.

FIG. 7 is a flow chart of steps in exemplary processes that may be used in the reading method of a non-volatile memory according to an exemplary embodiment of the invention. Referring to both FIGS. 6 and 7, which is directed to the reading of the first storage position as indicated in step S710, the first storage position is read according to the main voltage distribution group. According to the detail process flow of step S710, the voltage of the first storage position is detected in step S711. Then, as in step S712, the voltage from the first storage position and the read verification voltage defined by the threshold voltage distribution curves in the main voltage distribution group are compared to identify a read level that corresponds to the first storage position. For example, as shown in FIG. 6, the read verification voltages RD51 to RD53 are defined according to the threshold voltage distribution curves 611 to 614 in the main voltage distribution group 610. Accordingly, the voltage from the first storage position is compared with the read verification voltages RD51 to RD53 one-by-one to determine the corresponding read level of the first storage position.

On the other hand, regarding the reading of the second storage position, as shown in step S720, one of the secondary voltage distribution groups is selected to serve as a special voltage distribution group according to the read result of the first storage position. According to the detail process flow of step S720, the voltage from the second storage position is detected in step S721. Then, as in step S722, a special voltage distribution group is selected from the secondary voltage distribution groups according to the read level corresponding to the first storage position. Further, in step S723, the voltage from the second storage position and the read verification voltage defined by the threshold voltage distribution curves in the special voltage distribution group are compared to identify the corresponding read level of the second storage position.

For example, as shown in FIG. 6, according to the threshold voltage distribution curves 561 to 564 in the secondary voltage distribution group 560, the read verification voltages RD61 to RD63 are defined. Similarly, according to the threshold voltage distribution curves 571 to 574 in the secondary voltage distribution group 570, the read verification voltages RD71 to RD73 are defined. Further, according to the threshold voltage distribution curves 581 to 584 in the secondary voltage distribution group 580, the read verification voltages RD81 to RD83 are defined. Accordingly, if the read level corresponding to the first storage position is level 1, the voltage from the second storage position and the read verification voltages RD61 to RD 63 defined by the threshold voltage distribution curves 561 to 564 are compared one-by-one to identify the read level corresponding to the second storage position. Similarly, if the read level corresponding to the first storage position is level 2 or level 3, the voltage from the second storage position and the read verification voltages RD71 to RD73 are compared one-by-one to identify the corresponding read level of the second storage position. Further, if the corresponding read level of the first storage position is level 4, the voltage from the second storage position and the read verification voltages RD81 to RD83 are compared one-by-one to identify the corresponding read level of the second storage position.

In other words, since the second storage position is programmed by referring to different secondary voltage distribution groups, the second storage position must refer to the read verification voltage of different groups to determine the level. More specifically, the reading of the second storage position is achieved by referring to the read level of the first storage position for selecting the read verification voltage of the different groups. Hence, during the reading of the second storage position, the read level of the first storage position must be read first prior to performing the reading of the second storage position.

Figure 8:
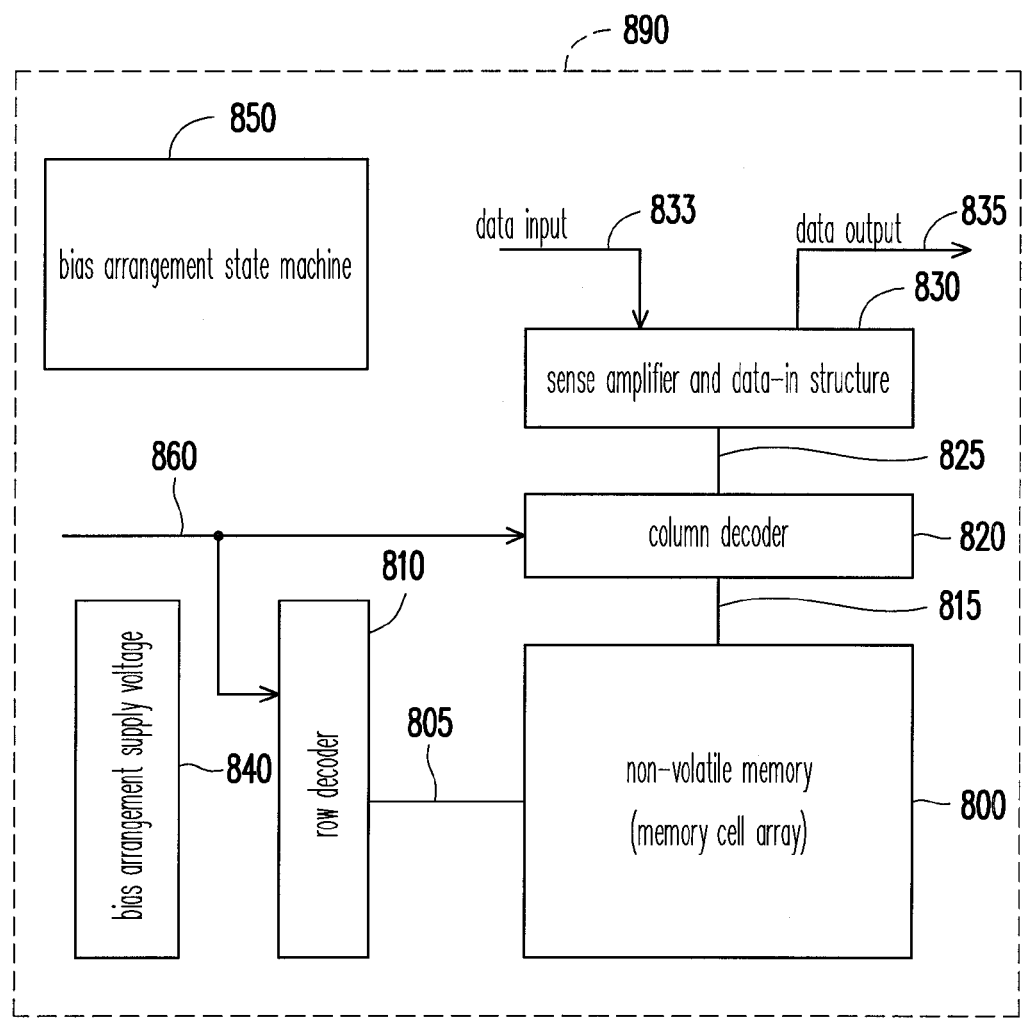
FIG. 8 is a simplified circuit block diagram of an integrated circuit in which an exemplary embodiment of the invention is applied.

FIG. 8 is a simplified circuit block diagram of an integrated circuit in which an exemplary embodiment of the invention is applied. The circuit 890 includes a non-volatile memory (memory cell array) 800, a row decoder 810, a column decoder 820, a sense amplifier and data-in structure 830, a bias arrangement supply voltage 840 and a bias arrangement state machine 850.

The memory array 800 is positioned on a semiconductor substrate, and a single memory cell thereof has a plurality of bits. The row decoder 810 is coupled to a plurality of bit lines 805 and is arranged along each row in the memory cell array 800. The column decoder 820 is coupled to a plurality of bit lines 815, and these bit lines 815 are arranged along each column in the memory cell array 800. The column decoder 820 further read and program data from the plurality of bits in the memory cell array 800. The universal serial bus 860 includes addresses that are provided to the row decoder 810 and the column decoder 820.

The sense amplifier and data-in structure 830 is coupled to the column decoder 820 through the universal serial bus 825. The data is input into the data input structure in the sense amplifiers and data-in structure 830 from the input/output port on the circuit 890, or other internal or external data source of the circuit 890 through the data-in line 833. In the above disclosed exemplary embodiment, the circuit 890 includes other circuits, such as processors of general purposes, an application circuit of a particular purpose, or an integrated module supported by the nonvolatile memory (memory cell array). The data is output to the input/output port on the circuit 890 or to other internal or external data destination of the circuit 890 from the sense amplifier in the sense amplifier and data-in structures 830 through the data-out line 835.

The bias arrangement state machine 850 includes an apparatus that detects the states of the first storage position and the second storage position of a memory cell and an apparatus that selects the main voltage distribution group and the secondary voltage distribution group according to the first storage position and the second storage position. In this exemplary embodiment, a controller of the bias arrangement state machine 850 controls the applications of bias arrangement supply voltages 840, such as voltages of reading, programming, erasing, erase verifying and program verifying, according to the main voltage distribution group and the secondary voltage distribution group. The controller may apply the traditional special-purpose logic circuitry. In an alternative exemplary embodiment, the controller includes a general-purpose processor, for executing a computer program and controlling the operation of the device. In another exemplary embodiment, this controller uses a combination of a special-purpose logic circuitry and a general-purpose processor.

According to the exemplary embodiments above, the programming and the reading of the first storage position are executed according to the main voltage distribution group, and the programming and the reading of the second storage position are executed according to different secondary voltage distribution groups. The corresponding secondary voltage distribution group of the second storage position is selected according to the level of the first storage position. Hence, by replacing the secondary voltage distribution group, the problems of not being able to identify level 1 and level 2 due to the second bit effect could be avoided to increase the reliability of the device.

It will be apparent to those skilled in the art that various modifications and variations can be made to the structure of the present invention without departing from the scope or spirit of the invention. In view of the foregoing descriptions, it is intended that the present invention covers modifications and variations of this invention if they fall within the scope of the following claims and their equivalents.

What is claimed is:

1. An operation method of a non-volatile memory, suitable for a multi-level cell having a first storage position and a second storage position, the operation method of the non-volatile memory comprising:
    setting a main voltage distribution group and a plurality of secondary voltage distribution groups for defining N levels, wherein each of the main voltage distribution group and the plurality of secondary voltage distribution groups comprises N threshold voltage distribution curves, corresponding to the N levels, wherein N is an integer greater than 2;
    selecting a first operation level and a second operation level from the N levels according to a programming command;
    programming the first storage position to the first operation level according to a threshold voltage distribution curve, corresponding to the first operation level, of the N threshold voltage distribution curves in the main voltage distribution group; and
    selecting a secondary voltage distribution group from the plurality of secondary voltage distribution groups according to the first operation level, and programming the second storage position to the second operation level according to a threshold voltage distribution curve, corresponding to the second operation level, in the selected secondary voltage distribution group.

2. The operation method of claim 1, wherein the step of setting the plurality of secondary voltage distribution groups comprises:
    setting N reference curves, wherein a distance between a first reference curve and a second reference curve of the N reference curves is a sum of a shift amount and a sense window, and a distance between two adjacent reference curves among the second reference curve to an $N^{th}$ reference curve is the sense window;
    moving concurrently the second reference curve to the $N^{th}$ reference curve along a predetermined direction toward the first reference curve to reduce the distance between the first reference curve and the second reference curve, and setting the N threshold voltage distribution curves in a first secondary voltage distribution group according to the N reference curves after the distance is reduced;
    setting the N threshold voltage distribution curves in a second secondary voltage distribution group according to the N reference curves; and
    moving concurrently the second reference curve to the $N^{th}$ reference curve in an opposite direction of the predetermined direction to increase the distance between the first reference curve and the second reference curve, and setting the N threshold voltage distribution curves in a third secondary voltage distribution group according to the N reference curves after the distance is increased.

3. The operation method of claim 2, wherein the shift amount is a shift amount of the first reference curve formed due to an $N-1^{th}$ reference curve.

4. The operation method of claim 2, wherein the step of setting the main voltage distribution group comprises:

setting the N threshold voltage distribution curves in the main voltage distribution group according to the N reference curves.

5. The operation method of claim 2, wherein the step of selecting the secondary voltage distribution group of the plurality of secondary voltage distribution groups according to the first operation level comprises:
   selecting the first, secondary voltage distribution group from the plurality of secondary voltage distribution groups when the first operation level is a first level among the N levels;
   selecting the second, secondary voltage distribution group from the plurality of secondary voltage distribution groups when the first operation level is one of a second level through an $N-1^{th}$ level among the N levels; and
   selecting the third, secondary voltage distribution group from the plurality of secondary voltage distribution groups when the first operation level is an $N^{th}$ level among the N levels.

6. The operation method of claim 1 further comprising:
   reading the first storage position according to the main voltage distribution group; and
   selecting another secondary voltage distribution group of the secondary voltage distribution groups as a special voltage distribution group according to a read result of the first storage position, and reading the second storage position according to the special voltage distribution group.

7. The operation method of claim 6, wherein the step of reading the first storage position according to the main voltage distribution group comprising the steps of:
   sensing a voltage from the first storage position; and
   comparing the voltage from the first storage position and a read verification voltage defined by the N threshold voltage distribution curves in the main voltage distribution group to identify a read level corresponding to the first storage position.

8. The operation method of claim 7, wherein the step of selecting the another secondary voltage distribution group of the secondary voltage distribution groups according to the read result of the first storage position, and the step of reading the second storage position according to the special voltage distribution group comprising:
   sensing a voltage from the second storage position;
   selecting the special voltage distribution group from the plurality of secondary voltage distribution groups according to the read level corresponding to the first storage position; and
   comparing the voltage from the second storage position and the read verification voltage defined by N threshold voltage distribution curves in the special voltage distribution group to identify a read level corresponding to the second storage position.

9. A nonvolatile memory, comprising:
   a source region and a drain region disposed in a substrate;
   a charge storage structure, disposed on the substrate between the source region and the drain region, wherein the charge storage structure comprises a first storage position and a second storage position;
   a gate, disposed on the charge storage structure; and
   a logic circuit, used in setting a main voltage distribution group and a plurality of second distribution groups for defining N levels, and each of the main voltage distribution group and the plurality of second distribution groups comprising N threshold voltage distribution curves, corresponding to the N levels, wherein N is an integer greater than 2, and the logic circuit selects a first operation level and a second operation levels from the N levels according to a programming command, and the logic circuit programs the first storage position to the first operation level according to a threshold voltage distribution curve, corresponding to the first operation level, of the N threshold voltage distribution curves in the main voltage distribution group, and the logic circuit selects a secondary voltage distribution group of the plurality of secondary voltage distribution groups according to the first operation level, and program the second storage position to the second operation level according to a threshold voltage distribution curve, corresponding second operation level, of the N threshold voltage distribution curves of the selected secondary voltage distribution group.

10. The nonvolatile memory of claim 9, wherein when the logic circuit is setting each of the plurality of secondary voltage distribution groups, the logic circuit sets N reference curves, wherein a distance between a first reference curve and a second reference curve of the N reference curves is a sum of a shift amount and a sense window, and a distance between two adjacent reference curves among the second reference curve to an $N^{th}$ reference curve is the sense window, and the logic circuit moves the second reference curve to the $N^{th}$ reference curve concurrently in a predetermined direction toward the first reference curve to set the N threshold voltage distribution curves in a first secondary voltage distribution group, and the logic circuit sets the N threshold hold voltage distribution curves in a second secondary voltage distribution group according to the N reference curves, and the logic circuit moves the second reference curve to the $N^{th}$ reference curve concurrently in an opposite direction of the predetermined direction to set the N threshold voltage distribution curves in a third secondary voltage distribution group.

11. The nonvolatile memory of claim 10, wherein the shift amount is a shift amount of the first reference curve formed due to an $N-1^{th}$ reference curve.

12. The nonvolatile memory of claim 10, wherein when the logic circuit is setting the main voltage distribution group, the logic circuit further sets the N threshold voltage distribution curves in the main voltage distribution group according to the N reference curves.

13. The nonvolatile memory of claim 10, wherein when the first operation level is a first level among the N levels, the logic circuit selects the first secondary voltage distribution group from the plurality of secondary voltage distribution groups, when the first operation level is one of a second level through an $N-1^{th}$ level among the N levels, the logic circuit selects the second secondary voltage distribution group from the plurality of secondary voltage distribution groups, when the first operation level is an $N^{th}$ level among the N levels, the logic circuit selects the third secondary voltage distribution group from the plurality of secondary voltage distribution groups.

14. The nonvolatile memory of claim 9, wherein the logic circuit reads the first storage position according to the main voltage distribution group, and the logic circuit further selects another secondary voltage distribution group of the plurality of secondary voltage distribution groups as a special voltage distribution group according to a read result of the first storage position and reads the second storage position according to the special voltage distribution group.

* * * * *